United States Patent [19]
Ohuchi et al.

[11] 4,079,405
[45] Mar. 14, 1978

[54] SEMICONDUCTOR PHOTODETECTOR

[75] Inventors: Hirobumi Ohuchi; Masahiro Okamura; Sumio Kawakami; Takuzo Ogawa, all of Hitachi, Japan

[73] Assignee: Hitachi, Ltd., Japan

[21] Appl. No.: 589,675

[22] Filed: Jun. 24, 1975

[30] Foreign Application Priority Data

Jul. 5, 1974 Japan ................................. 49-76322
Jan. 29, 1975 Japan ................................. 50-11227

[51] Int. Cl.² ......................................... H01L 29/48
[52] U.S. Cl. ....................................... 357/30; 357/15; 357/52; 357/89
[58] Field of Search ..................... 357/52, 13, 30, 15, 357/89

[56] References Cited

U.S. PATENT DOCUMENTS

| | | | |
|---|---|---|---|
| 3,534,231 | 10/1970 | Biard | 317/235 |
| 3,742,317 | 6/1973 | Shao | 317/235 R |
| 3,769,558 | 10/1973 | Lindmayer | 317/234 R |
| 3,820,235 | 6/1974 | Goldman | 29/578 |
| 3,860,945 | 1/1975 | Dawson | 357/14 |
| 3,911,465 | 10/1975 | Foss | 357/23 |
| 3,959,646 | 5/1976 | de Cremoux | 250/211 J |
| 3,978,511 | 8/1976 | Digoy | 357/30 |

OTHER PUBLICATIONS

Schneider, *Bell System Tech. Journal*, Nov. 1966, pp. 1611-1637.

*Primary Examiner*—Martin H. Edlow
*Attorney, Agent, or Firm*—Craig & Antonelli

[57] ABSTRACT

A semiconductor photodetector comprising a first semiconductor layer having N-type conductivity; a second semiconductor layer having N-type conductivity, disposed in the vicinity of the first semiconductor layer and having a resistivity higher than that of the first semiconductor layer; a third region having P-type conductivity, disposed in the vicinity of the second semiconductor layer and having a thickness smaller than that of the second semiconductor layer; a first main electrode kept in ohmic contact with the first semiconductor layer; and a second main electrode kept in ohmic contact with a portion of the third region, the surface of the third region serving as a light receiving surface.

10 Claims, 13 Drawing Figures

FIG. 4
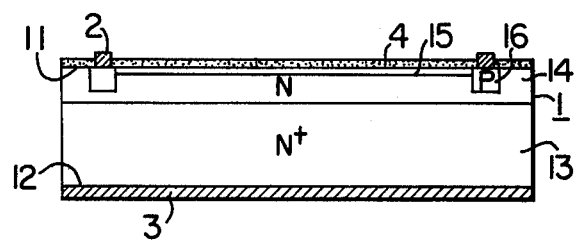
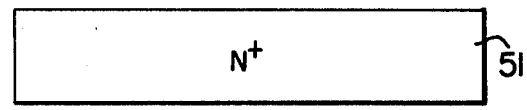
FIG.5a
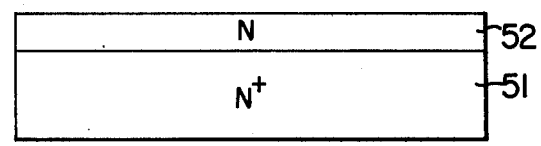
FIG.5b
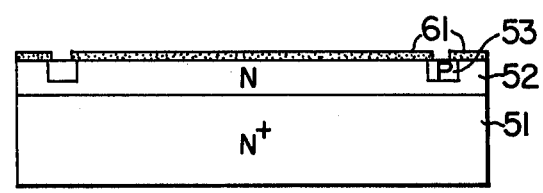
FIG.5c

SEMICONDUCTOR PHOTODETECTOR

The present invention relates to a semiconductor photodetector which transduces light signals into electric signals.

Phototubes are widely used as means for transducing light signals into electric signals. The semiconductor photodetector utilizes, in its photoelectric energy conversion, the phenomenon that when a semiconductor substrate having a PN junction is exposed to light, current is generated due to photo-excitation. Moreover, the semiconductor photodetector has some advantages over the phototube in such points as follows: (1) long life, (2) little deterioration due to aging, (3) small bias voltage for drive and (4) facility in the reduction of size. For this reason, the phototube is now being superseded by the semiconductor photodetector. However, there are still left unsolved various problems which must be explained in using the semiconductor photodetector in practice in place of the phototube.

Now, the above mentioned problems will be described in the case of a spectrophotometer.

In a measuring instrument such as spectrophotometer, the light source and the wavelength-sensitivity characteristic of the photodetector are the important factors. As a light source for emitting radiation having wavelengths ranging from visible rays to near infrared rays a tungsten lamp, may be used the radiation energy of which has a peak at a wavelength of about 1 μm and rapidly decreases for shorter wavelengths. On the other hand, the spectral sensitivity of the phototube is high for short wavelengths and becomes low in the long wavelength range. Accordingly, the photoresponse of a spectrophotometer, using a combination of a tungsten lamp and a phototube, is high in the wavelength range where the radiant energy from the source is small and low in the wavelength range where the radiant energy is large. Thus, a spectral response which is approximately constant over a wide range of wavelengths can be obtained.

A conventional semiconductor photodetector made of silicon is sensitive to radiation ranging from visible to near infrared rays and the element has been designed as described below. The absorption coefficient of silicon is large for short wavelengths and decreases toward long wavelengths, so that the silicon photodetector is usually so designed as not to lower the sensitivity to long wavelengths for which the absorption coefficient is small. It is therefore customary to determine the thickness of the active region of the photodetector to be about $1/\alpha$, where $\alpha$ is the absorption coefficient. For example, silicon has an absorption coefficient of about 500 cm$^{-1}$ for a wavelength of 0.9 μm so that the thickness of the active region is about 20 μm. In a semiconductor using a silicon substrate, light incident on the silicon substrate is absorbed in the substrate to generate photo-excited carriers therein. Of the photo-excited carriers those which are excited in the active region reach the PN junction and contribute to photocurrent. Now, let the absorption coefficient for light of wavelength $\lambda$ be denoted by $\alpha(\lambda)$, the rate of the incident light absorbed in the active region having a thickness of $d_1$ by $\eta$, and the distribution with respective to wavelength of light quanta radiated from the 2848° K filament of a tungsten lamp by $P(\lambda)$. Then it is considered that the output photocurrent of the semiconductor photodetector with the above mentioned tungsten lamp used as light source is proportional to $\eta \cdot P(\lambda) = [1 - \exp(-\alpha(\lambda)d_1)] \cdot P(\lambda)$. FIG. 1 shows the relationship between the wavelength of the incident light and the output photocurrent $\eta \cdot P(\lambda)$ in the case where the active region is 20 μm thick. It is seen from FIG. 1 that there is a large difference between the output for short wavelengths and the output for long ones, the output for the long wavelengths being very large. If a semiconductor photodetector having such a characteristic as above is used as a photodetector for a spectrophotometer using a tungsten lamp as a light source, the output current of the photodetector is small in the short wavelength range where the radiant energy from the light source is small and large in the long wavelength range where the radiant energy is large. Then, the spectrophotometer cannot be used in practice since its output current varies considerably with wavelengths. Namely, in the measurement of light having shorter wavelengths, the stray components of light having longer wavelengths are not negligible, the precision being lowered. In order to eliminate the stray components, a suitable filter can be used, but in that case the manipulation is adversely complicated. In case where a sample is measured by two monochromatic components of light having wavelengths of 0.4 μm and 0.9 μm and the resultant characteristics are compared with each other, the signal output for 0.9 μm, at which the radiant energy from the light source and the sensitivity of the photodetector take large values, is by far larger than that for 0.4 μm, so that some electric circuit means are required to balance the two output levels with each other.

It is therefore one object of the present invention to provide a semiconductor photodetector whose output characteristic is flat over a wide range of wavelengths.

Another object of the present invention is to provide a semiconductor photodetector whose speed of response is very fast.

Yet another object of the present invention is to provide a semiconductor photodetector which can operate even when the bias voltage is zero.

A further object of the present invention is to provide a semiconductor photodetector which can be used as a photodetector in a spectrophotometer.

The feature of the present invention which has been made to attain the above mentioned objects, is the determination of the thickness of the active region to 1-3 μm. According to the present invention, there is provided a semiconductor photodetector comprising a first semiconductor region having one conductivity type; a second semiconductor region having the same conductivity type, disposed in the vicinity of the first semiconductor region and having a resistivity higher than that of the first semiconductor region; and a third region disposed in the vicinity of the second semiconductor region, having a thickness smaller than that of the second semiconductor region and forming an energy barrier between itself and the second semiconductor region, wherein the thickness of the second semiconductor region, i.e. active region, is 1-3 μm and the surface of the third region serves as a light receiving surface. The penetration depth into a semiconductor of the light to be detected increases with the increase in wavelength. Accordingly, if the thickness of the active region is chosen to be 1-3 μm, as is the case of the present invention, the majority of the carriers excited by light having long wavelengths are generated far beneath the active region (at a portion remote from the light receiving surface). However, the life time of the carriers generated there is so short that the rate at which they contribute to photocurrent is small and therefore the sensitivity can be leveled off over a wide range of wavelengths. This will be described later with the aid of FIGS. 2 and 3.

In the case where a semiconductor photodetector is used as a photodetector in a spectrophotometer, it is preferable to make less than 10 the ratio of the maximum to the minimum of the photocurrent in order to eliminate such problems as the degradation of precision due to the stray components of light, the exclusion of the stray components and complicated manipulation for adjusting levels. It is understood from FIG. 2 that the ratio of the maximum to the minimum of the photocurrent can be made less than 10 if the thickness of the active region is about 3 μm or less. As seen from FIG. 3, the change in the photocurrent output in the case where a tungsten lamp is used as a light source in a spectrophotometer is very small with respect to the change in wavelength if the thickness of the active region is in a range of 1–3 μm. Thus, a semiconductor photodetector whose output characteristic is flat (leveled off) over a wide range of wavelengths can be obtained.

If a conventional semiconductor element of similar kind in which the thickness of the active region is 20 μm is operated with zero or a very low bias voltage, the most part of the active region is not depleted so that the created carriers move due to the diffusion phenomenon. The time required for the carriers to move across a region having a width of W by diffusion is $W^2/D$, where D is diffusion constant. In general, the diffusion velocity is slower than the velocity of the carriers drifted under the influence of electric field, i.e. drift velocity. Hence, to increase the response speed of the element, it is preferable to move the carriers at the drift velocity.

The width $d_2$ of a depletion layer generally depends on the impurity concentration in the active region and in case of a one-sided abrupt P+N junction or an interfacial p-type inversion layer, for example, it is given by the following formulae (1) and (2).

$$d_2 = \sqrt{\frac{2\epsilon V_{bi}}{q \cdot N_D}} \quad (1)$$

$$d_2 = \sqrt{\frac{2\epsilon \psi_s(inv)}{q \cdot N_D}} \quad (2)$$

where q is the quantity of charges, ε the dielectric constant of the semiconductor, $N_D$ the impurity concentration in the N type active region, $V_{bi}$ the diffusion potential of the PN junction and ψs(inv) the surface potential necessary to form the inversion layer. Here, ψs(inv) is such that $\psi s(inv) \simeq (2kT/q) ln(N_D/n_i)$, where T is the absolute temperature, k is the Boltzmann's constant and $n_i$ the concentration of the intrinsic carriers in the semiconductor. Therefore, if the thickness of the active region is 1–3 μm and the resistivity in that region is higher than several ohm-cm, then the formed depletion layer can occupy the entire or most part of the active region even when the element is operated with zero or a very low bias voltage. Consequently, the photo-excited carriers are moved at the drift velocity and therefore the response speed of the element is increased.

It is preferable for the active region of the semiconductor photodetector according to the present invention to have a resistivity of at least several ohm-cm or an impurity concentration of less than $10^{15}$ atoms/cm³ in order to reduce the probability of recombination of the photo-excited carriers for increasing the photocurrent and to extend depletion layer throughout the active region even in the case of a zero or a very low bias voltage. Moreover, it is preferable to make the PN junction built in the active region as shallow as possible so as to enhance the sensitivity to shorter wavelengths corresponding to large absorption coefficients. In order to put the desirable points as described above into practice, there are some methods proposed: the method in which an oxide film is formed on the surface of the active region and the conductivity beneath the oxide film is inverted; the method using diffusion or epitaxial growth; and the method according to which a thin metal film is coated on the surface of the active region through ion plating, vapor-deposition or sputtering and the thin metal film is appropriately processed to form an energy barrier (inclusive of Schottky barrier). Since the Schottky barrier is formed between metal and semiconductor, the portion corresponding to the third region is the layer of metal or of metal-semiconductor alloy. In other cases, the third region is of semiconductor having a conductivity different from that of the second semiconductor region.

Other objects, features and advantages of the present invention will be more apparent when the following lines of the specification are read in conjunction with the attached drawings, in which.

Figure 6:
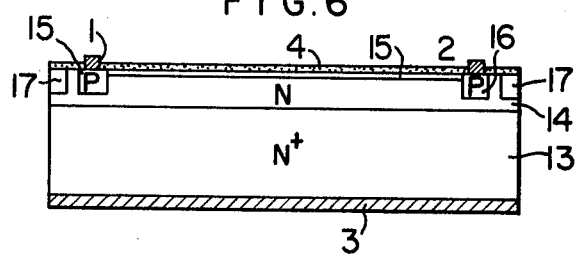
Figure 7:
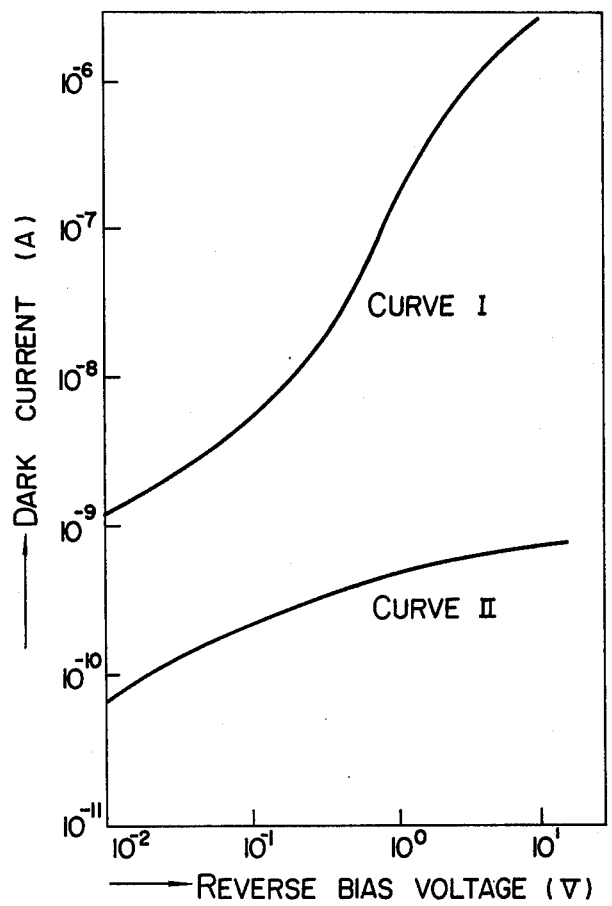

FIG. 4 schematically show in cross section a semiconductor photodetector as one embodiment of the present invention;

FIGS. 5a to 5f illustrate the steps of fabricating the semiconductor photodetector according to the present invention;

FIG. 6 schematically shows in cross section a semiconductor photodetector as a second embodiment of the present invention;

FIG. 7 shows curves representing dark current characteristics; and

Figure 8:
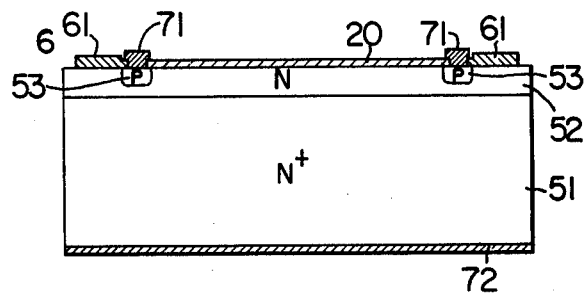

FIG. 8 schematically shows in cross section a semiconductor photodetector as a third embodiment of the present invention.

Now, the present invention will be described by way of embodiment as shown in the attached drawings.

In FIG. 4, a semiconductor substrate 1 having main surfaces 11 and 12 comprises a first semiconductor region 13 having N-type conductivity and a low resistivity; a second semiconductor region 14 having N-type conductivity and a resistivity higher than that of the first semiconductor region 13 and disposed in the vicinity of the first region 13; a third semiconductor region (so-called third region in this invention) 15 having P-type conductivity and a thickness smaller than that of the second semiconductor region 14 and embedded in the second region 14 with its surface exposed; and a fourth semiconductor region 16 called guard ring, having P-type conductivity and a thickness greater than that of the third semiconductor region 15 and embedded in the second semiconductor region 14, encircling the third region 15 along the boundary thereof, with its surface exposed. The second semiconductor region 14 forms the active region, the thickness of which is chosen to be 1-3 μm. The exposed surface of the third semiconductor region 15 on the main surface 11 serves as the light receiving area. A first main electrode 2 is in ohmic contact with the exposed surface of the fourth semiconductor region 16 in the main surface 11, a second main electrode 3 is in ohmic contact with the exposed surface of the first semiconductor region 13 in the main surface 12, and a silicon oxide film 4 covers the main surface 11 except that portion thereof which is occupied by the first main electrode 2. The semiconductor photodetector having such a structure as described above can attain the objects of the present invention.

Figure 1:
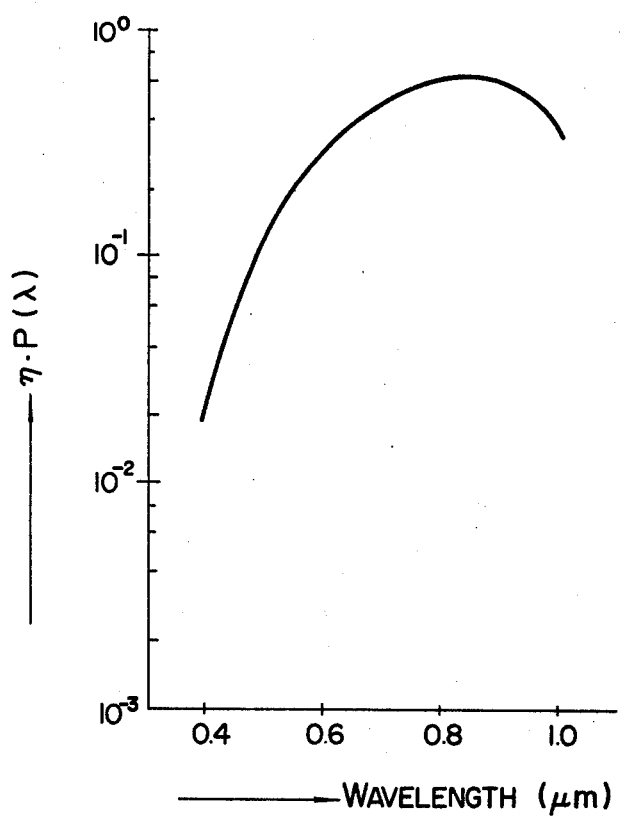
FIG. 1 is a characteristic curve representing the relationship between the wavelength of the incident light and the photocurrent output in a conventional semiconductor photodetector whose active region has a thickness of 20 μm.
Figure 2:
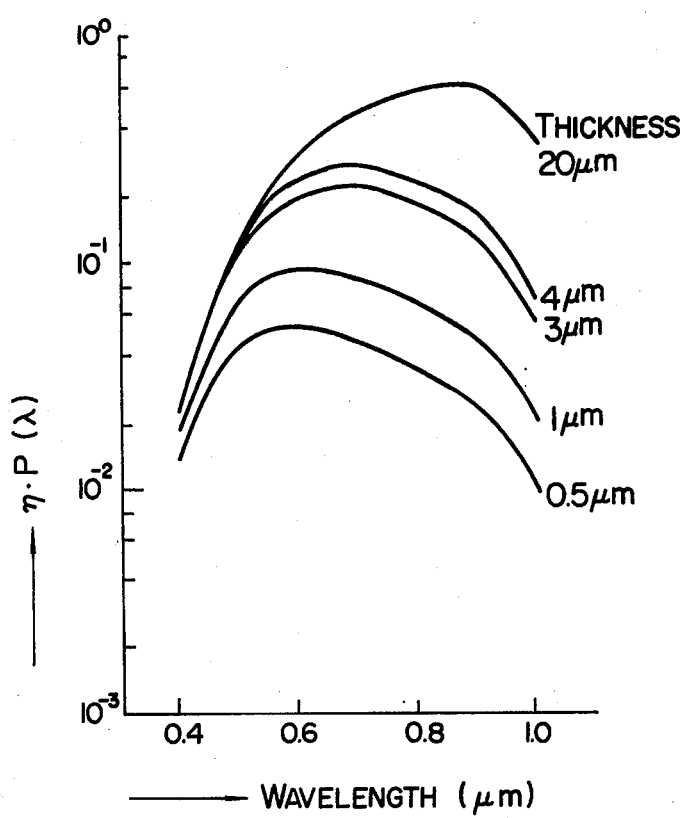
FIG. 2 shows characteristic curves representing the relationship between the wavelengths of incident light and the photocurrent outputs with the thickness of the active region as a parameter.
Figure 3:
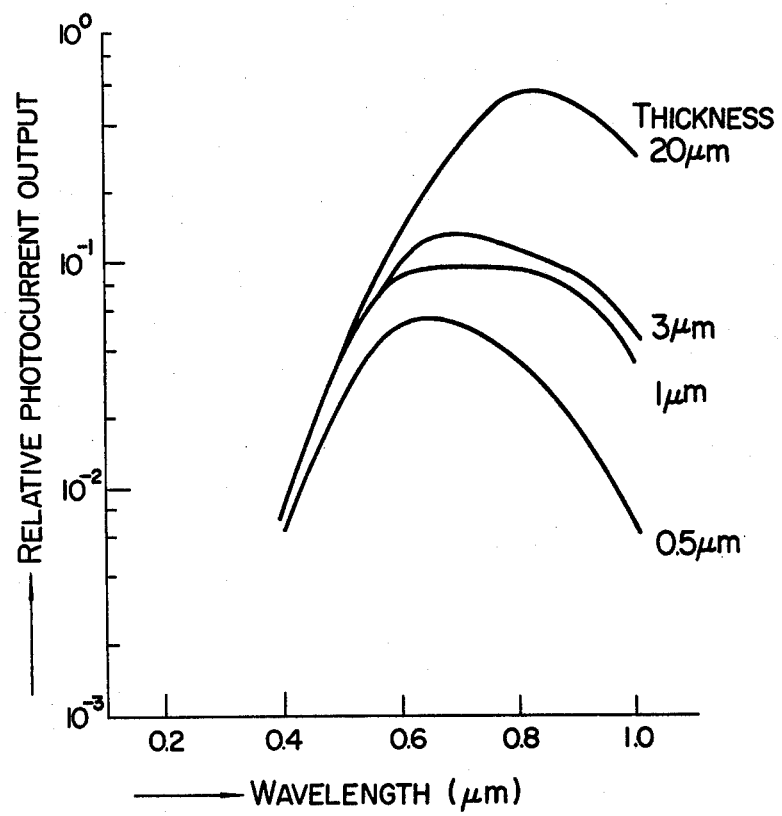
FIG. 3 shows characteristic curves representing the relationships between the wavelengths and the relative outputs of photocurrent in a spectrophotometer using a tungsten lamp as a light source, with the thickness of the active region as a parameter.
Figure 5D:
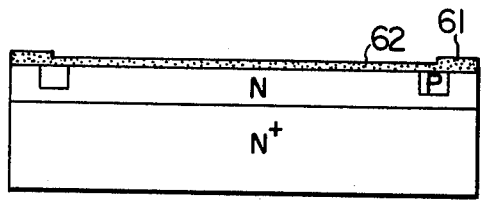
Figure 5E:
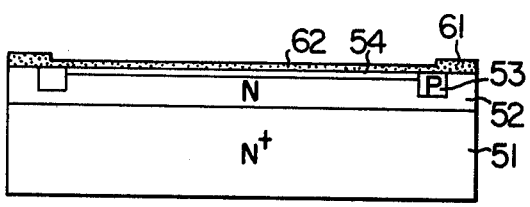
Figure 5F:
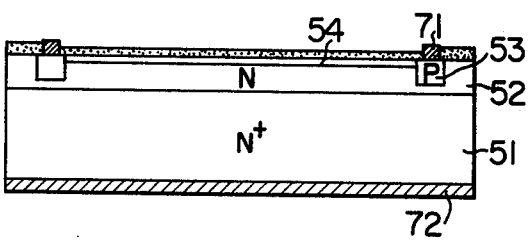

Next, the process of fabricating a semiconductor photodetector according to the present invention will be described with the aid of FIGS. 5a to 5f. An $N^+$-type semiconductor substrate 51 having a thickness of 150-200 μm to provide a sufficient strength for easy handling and a resistivity of less than 0.01 ohm-cm to facilitate ohmic contact and the reduce series resistance, is prepared (FIG. 5a). This semiconductor substrate serves as the above mentioned first semiconductor region 13. On this semiconductor substrate is formed through, for example, high purity epitaxial method an N-type layer 52 having a high resistivity of higher than several ohm-cm (FIG 5b). The N-type layer 52 serves as the aforementioned active region and its thickness is 3 μm. Boron atoms, for example, are diffused through selective diffusion into the N-type layer to form a ring-shaped P-type layer 53 to serve as the above described fourth semiconductor region (FIG. 5c). That part of the silicon oxide film 61 used for selective diffusion which lies on the portion of the surface of the N-type layer 52, enclosed with the annular P-type layer 53, is removed and a silicon oxide film 62 having a thickness of about 0.4 μm is re-formed through vapor phase chemical reaction method (FIG. 5d). The silicon oxide film 62 is subjected to heating treatment for a short time at about 950° C in argon atmosphere. As a result of this treatment, a P-type inversion layer 54 having a thickness of less than 0.1 μm is formed in the surface of the N-type layer 52 near the silicon oxide film 62 (FIG. 5e). The inversion layer 54 serves as the aforementioned third semiconductor region. Finally, electrodes 71 and 72 are disposed in ohmic contact with the P-type layer 53 and the semiconductor substrate 51, respectively, to complete a photodetector according to the present invention. In the above process, the N-type layer 52 is formed through epitaxial method, but other methods may be resorted to. For example, another method is to diffuse phosphorus deeply into one surface of an N-type semiconductor substrate having a high resistivity, to form an $N^+$-type layer and thereafter to polish the highly resistive N-type layer to a thickness of 1-3 μm. In the above-mentioned embodiment, the silicon oxide film 52 is employed to form the inversion layer 54. Other insulator films, however, can also be employed in place of the silicon oxide film, even if they are of optical transparency and form an inversion layer in an interface between a semiconductor and themselves. An insulator film made of such a material as $A_2O_3$, $Si_3N_4$, or $MgF_2$ may be employed. It is preferable in the fabrication of a semiconductor photodetector according to the process described above, to choose the thickness of the silicon oxide film 62 in a range of 0.1-0.4 μm. If the thickness $d_3$ of the oxide film is greater than the proposed values, the sensitivity characteristic and especially the sensitivity to ultraviolet range exhibits undulations due to interference effect. This phenomenon is described by the expression $$2nd_3 = (m + \tfrac{1}{2})\lambda_1,$$

where $n$ is the refractive index of the oxide film, $\lambda 1$ the wavelength for which interference appears conspicuous, and $m$ the integers (0, 1, 2, ... ). As is known from the formula, the smaller is the thickness $d_3$, the slower is the undulation and the more leveled off is the sensitivity characteristic. If there are many peaks and troughs in the spectrum-sensitivity characteristic due to the interference effect, the amplitudes of the signals to be measured cannot be directly determined but the measurement data must be subjected to correction. In order to eliminate such a drawback, it is necessary to reduce the thickness of the oxide film. However, if the oxide film is too thin (thinner than 0.1 μm), the homogeneity of the oxide film is sacrificed so that the sensitivity has an irregular distribution over the light receiving area. When the thickness of the oxide film is equal to or less than 0.4 μm, the number of the pairs of the peaks and the troughs of the sensitivity due to the interference taking place in an ultraviolet range of wavelengths 0.2–0.4 μm can be equal to or less than three (for example, if $d_3$ is 0.8 μm, six pairs of peaks and troughs appear) so that the condition for an ordinary light receiving element is satisfied by the characteristic of the thus completed photodetector.

FIG. 6 shows a semiconductor photodetector an another embodiment of the present invention. The feature of this embodiment is the provision of a fifth semiconductor region 17 having N-type conductivity and an impurity concentration higher than that of the second semiconductor region 14, and so embedded in the second semiconductor region 14 as to encircle the third semiconductor region 16, with its surface exposed in the main surface. In the structure shown in FIG. 4 in which the second semiconductor region 14 has a high resistivity, a layer having an opposite conductivity, i.e. induced channel, is formed in the vicinity of the surface of the portion of the second semiconductor region 14 around the fourth semiconductor region 16 due to the influence by the charges and states in the oxide film formed on that portion of the second region. The induced channel serves as a path for reverse leakage current, which increases the dark current and therefore degrades the precision in measurement. According to this embodiment, the fifth semiconductor region 17 prevents the formation of such an induced channel so that the dark current can be rendered small.

FIG. 7 shows the dark current characteristics corresponding respectively to the cases with and without the fifth semiconductor region 17. The figure shows that the dark current is smaller by more than ten times in the curve II corresponding to the case with the fifth region, than in the curve I corresponding to the case without the fifth region.

FIG. 8 shows in cross section a semiconductor photodetector using a Schottky barrier, as an embodiment of the present invention. The process of fabricating the semiconductor photodetector will be described in the following.

As an N+-type substrate 51 is used a semiconductor wafer having a thickness of 150–200 μm to provide a sufficient strength for easy handling and a resistivity of less than 0.01 ohm-cm to facilitate ohmic contact and to reduce series resistance. On the substrate 51 is formed through epitaxial growth method an N-type layer 52 having a resistivity of higher than several ohm-cm and a thickness of 3 μm. A P-type layer 53 having a thickness of about 2 μm is formed in a portion of the N-type layer 52 by the well-known selective diffusion of boron. The oxide film formed on the surfaces of the layers 52 and 53 as a result of the preceding steps of process, is removed except the portion 61. The exposed surfaces of the layers 52 and 53 are etched slightly to remove defects and impurities due to the formation of the oxide layers. Then, a film of gold having a thickness of 50A is formed on the entire surface by the method of vacuum evaporation and only a desired portion 20 of the gold film is left by the well-known photoetching method. Moreover, metal films are deposited through vacuum evaporation to form electrodes 71 and 72. The element thus fabricated is mounted on a stem and furnished through wire bonding with lead wires.

In this device, the gold film 20 and the semiconductor 52 form a Schottky barrier so that the completed photodetector has a high sensitivity.

In this embodiment, the Schottky barrier is formed by vapor-deposited gold film, but platinum or silver may be used in place of gold and moreover, as to the process of forming the film, sputtering or ion plating method may be substituted for the vacuum evaporation. It is a matter of course that all these alterations or modifications fall within the true spirit and scope of the present invention.

Also, the case where an interfacial layer of sintered metal is formed between the metal and the semiconductor due to the heating treatment for a short time after the metal film has been formed on the semiconductor within the scope of the present invention. It is preferable in this case to provide the fifth semiconductor region as mentioned above.

Furthermore, it is apparent that a photodetector having a complementary structure obtained by effecting inversions of conductivity types such as N+→P+, N→P and P→N, can also be obtained according to the present invention.

What we claim is:

1. A semiconductor photodetector comprising a semiconductor substrate having a pair of main surfaces and three continuous semiconductor regions between said main surfaces, a first semiconductor region having one conductivity and exposed in one of said main surfaces, a second semiconductor region having the same conductivity, a resistivity higher than that of said first semiconductor region and a thickness of 1–3 μm, and a third semiconductor region having a thickness smaller than that of said second semiconductor region and a conductivity opposite to that of said first and second semiconductor regions, exposed in the other main surface, and forming a PN junction between itself and said second semiconductor region and the surface of said third semiconductor region serving as a light receiving area;

a first main electrode in ohmic contact with said first semiconductor region in said one main surface; and a second main electrode in ohmic contact with a portion of said third semiconductor region in said other main surface.

2. A semiconductor photodetector as claimed in claim 2, wherein the thickness of said third semiconductor region is greater in the peripheral portion thereof than in the other portions thereof.

3. A semiconductor photodetector as claimed in claim 2, wherein the resistivity of said second semiconductor region is higher than several ohm-cm.

4. A semiconductor photodetector as claimed in claim 1, wherein said third semiconductor region is an inversion layer formed in the surface of said second semiconductor region by forming an insulator film in said surface of said second semiconductor region through vapor phase chemical reaction and by secondly subjecting said insulator film to heating treatment.

5. A semiconductor photodetector as claimed in claim 4, wherein said insulator film has a thickness of 0.1–0.4 μm.

6. A semiconductor photodetector as claimed in claim 2, wherein a fourth semiconductor region having the same conductivity type as said second semiconductor region and an impurity concentration higher than that of said second semiconductor region, is so formed in said second semiconductor region as to encircle said third semiconductor region, with its surface exposed in the surface of said second semiconductor region.

7. A semiconductor photodetector as claimed in claim 2, wherein the resistivity of said second semiconductor region is higher than several ohm-cm.

8. A semiconductor photodetector as claimed in claim 3, wherein said third semiconductor region is an inversion layer formed in the surface of said second semiconductor region by forming an insulator film in said surface of said second semiconductor region through vapor phase chemical reaction and by secondly subjecting said insulator film to heating treatment.

9. A semiconductor photodetector as claimed in claim 8, wherein said insulator film has a thickness of 0.1–0.4 μm.

10. A semiconductor photodetector as claimed in claim 3 wherein a fourth semiconductor region having the same conductivity type as said second semiconductor region and an impurity concentration higher than that of said second semiconductor region is so formed in said second semiconductor region as to encircle said third semiconductor region, with its surface exposed in the surface of said second semiconductor region.

* * * * *